United States Patent [19]
Noguchi

[11] Patent Number: 5,969,393
[45] Date of Patent: *Oct. 19, 1999

[54] SEMICONDUCTOR DEVICE AND METHOD OF MANUFACTURE OF THE SAME

[75] Inventor: Mitsuhiro Noguchi, Kawasaki, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/712,650

[22] Filed: Sep. 11, 1996

[30] Foreign Application Priority Data

Sep. 14, 1995 [JP] Japan .................................. 7-237341

[51] Int. Cl.[6] .................................................. H01L 29/76
[52] U.S. Cl. ........................... 257/396; 257/397; 257/513
[58] Field of Search .................................... 257/394, 395, 257/396, 397, 398, 399, 510, 513, 640, 649, 347

[56] References Cited

U.S. PATENT DOCUMENTS 5,221,857 6/1993 Kano ........................................ 257/539
5,650,654 7/1997 Noble ..................................... 257/372

FOREIGN PATENT DOCUMENTS 60-9139  1/1985  Japan .
2-23631  1/1990  Japan .

*Primary Examiner*—Sara Crane
*Attorney, Agent, or Firm*—Oblon, Spivak, McClelland, Maier & Neustadt, P.C.

[57] ABSTRACT

A semiconductor device comprises a semiconductor substrate having a major surface, a semiconductor region defined between at least two trenches formed in the major surface, a first insulating layer formed on at least side walls of each of the trenches, and a second insulating layer formed in a predetermined area of the surface of the semiconductor region to contact the first insulating layer. The thickness of the first insulating layer at the top of the side walls is set larger than the thickness of the second insulating layer.

21 Claims, 12 Drawing Sheets

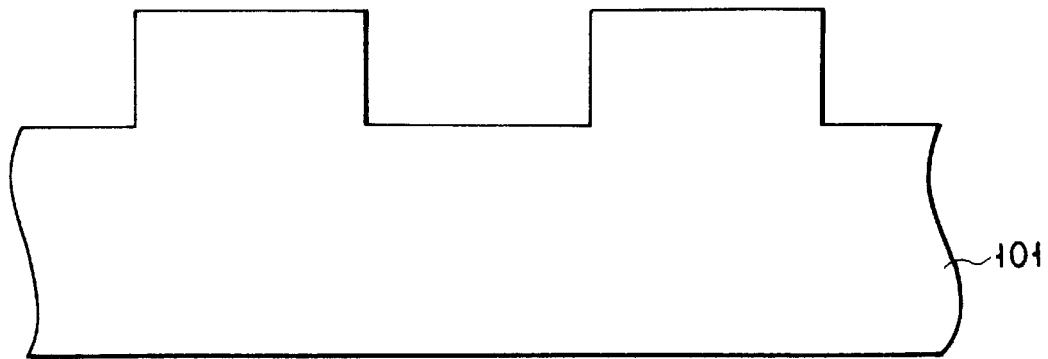
F I G. 3A
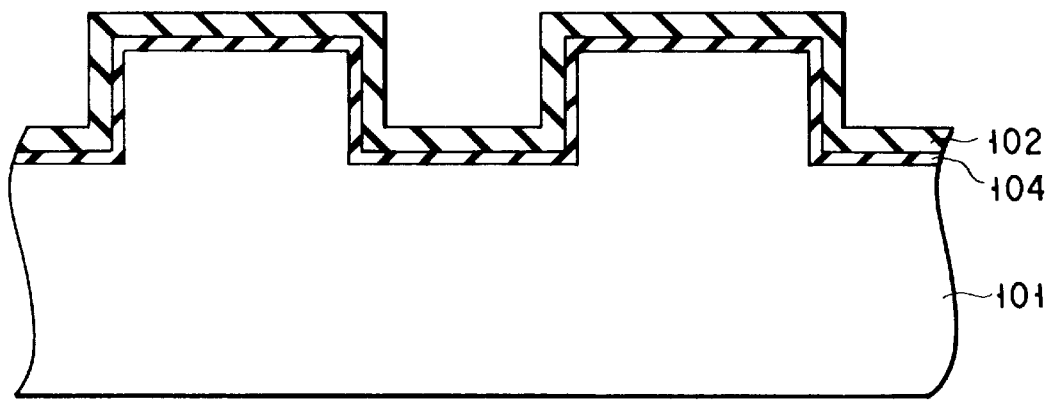
F I G. 3B
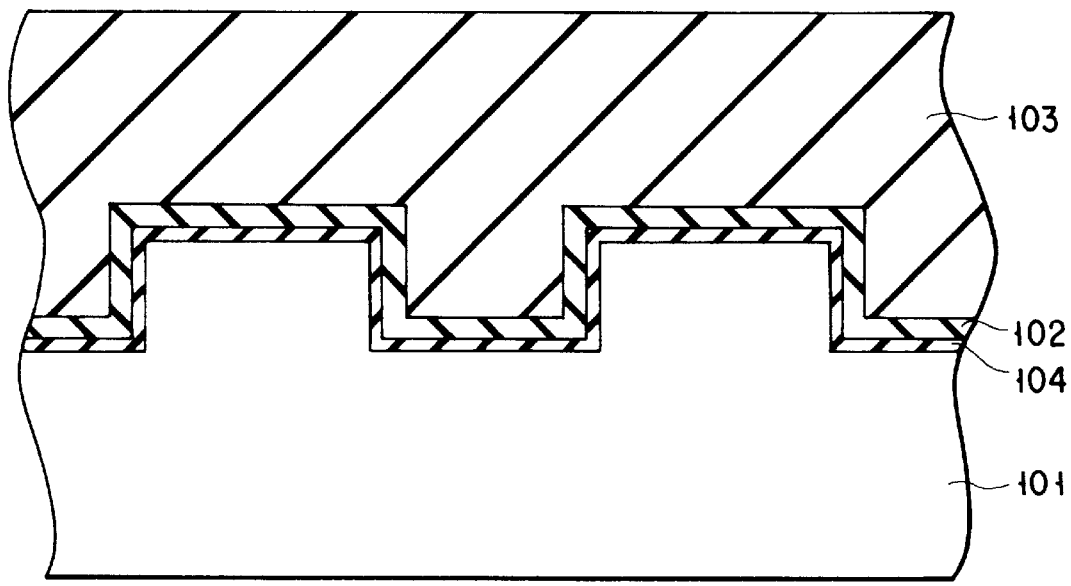
F I G. 3C

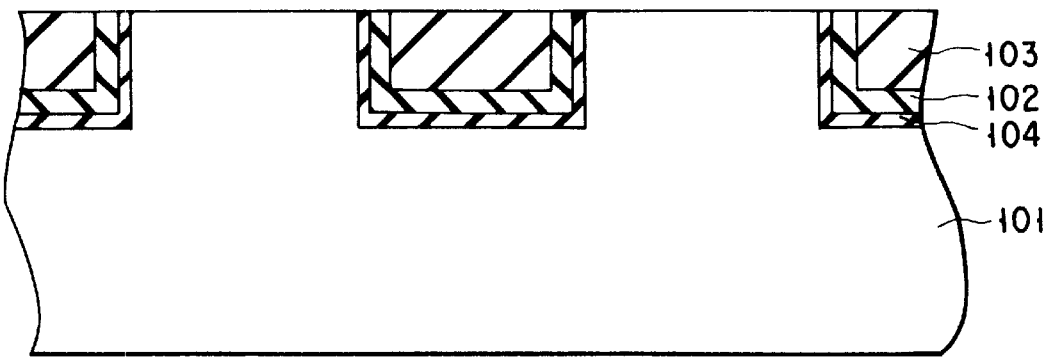
F I G. 3D
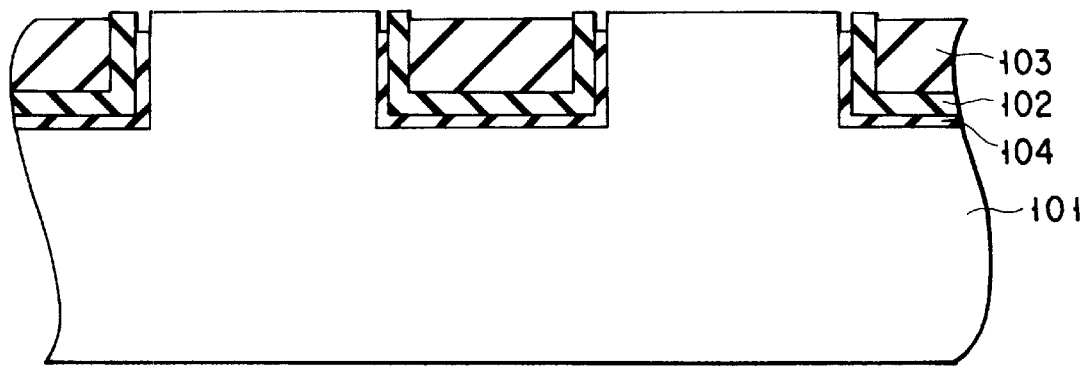
F I G. 3E
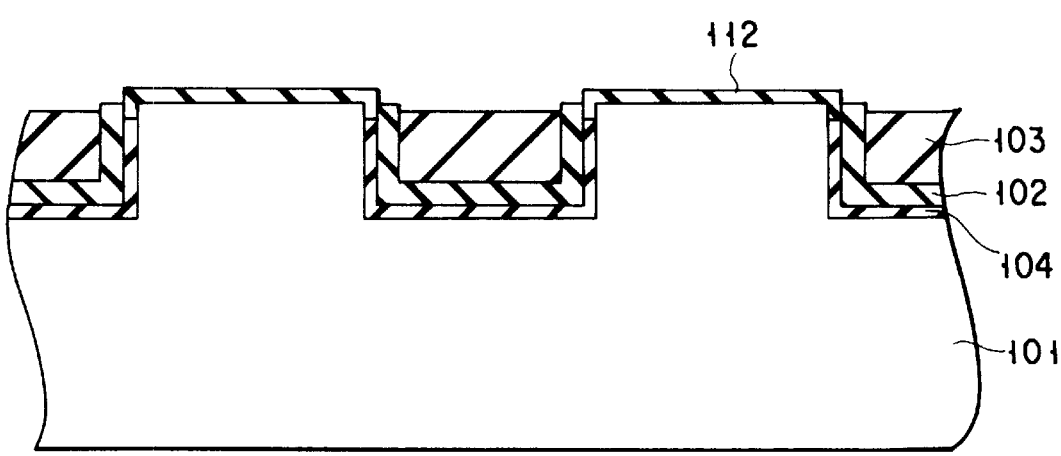
F I G. 3F

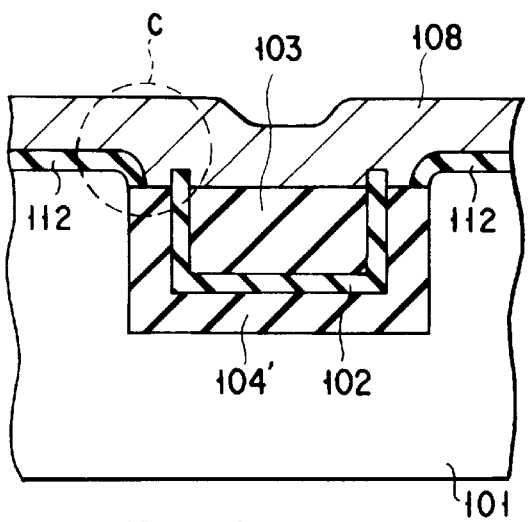
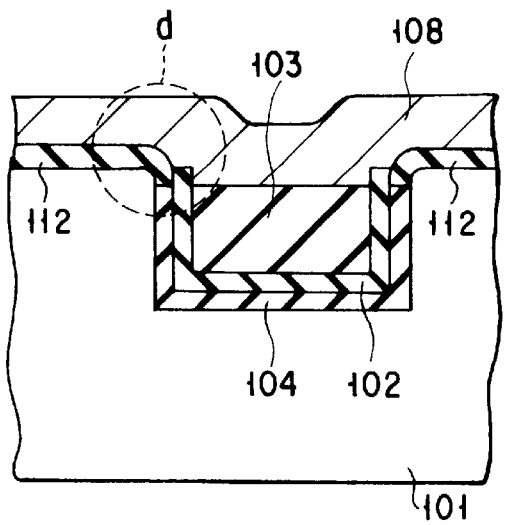
F I G. 4A    F I G. 4B
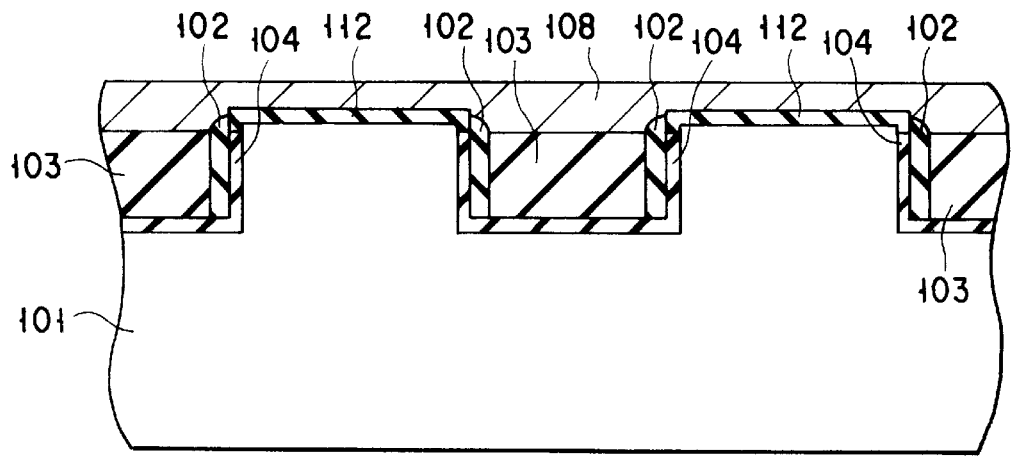
F I G. 5
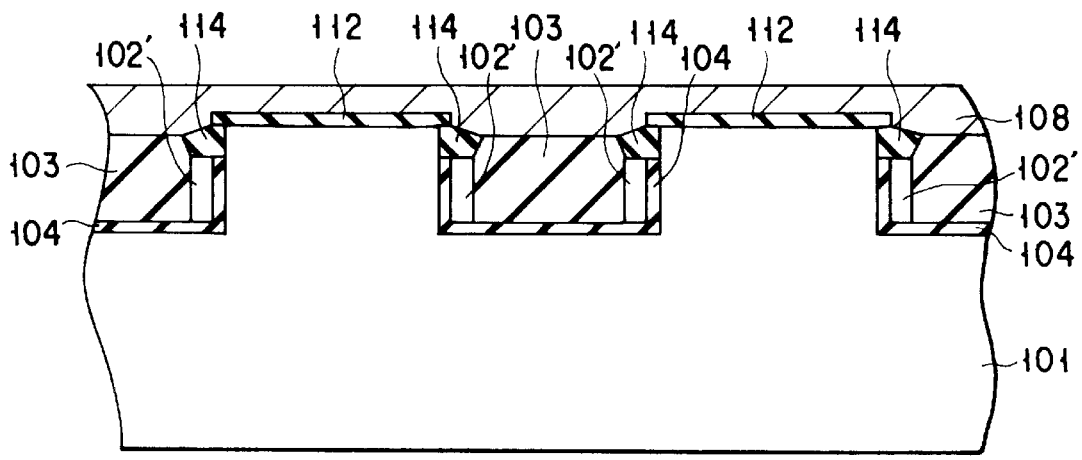
F I G. 6

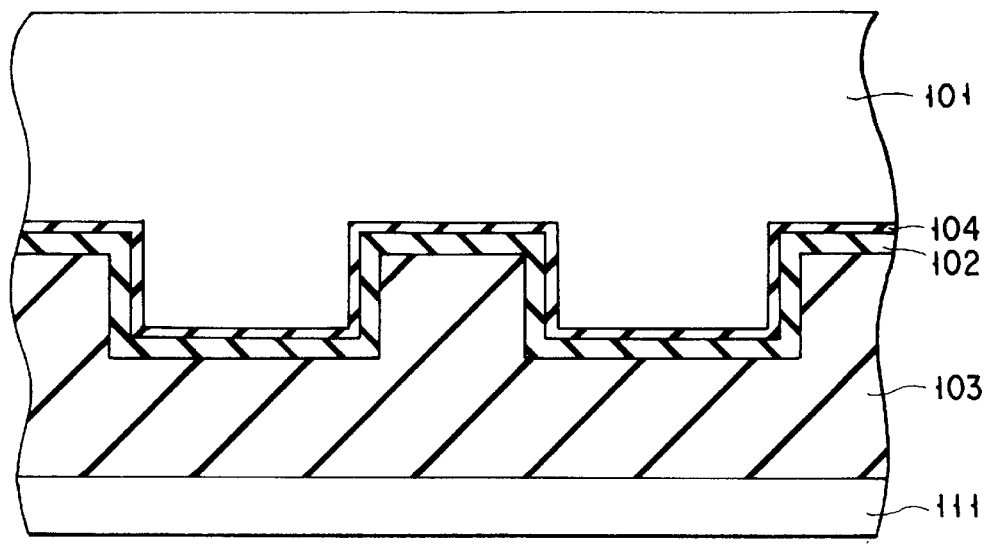
F I G. 9A
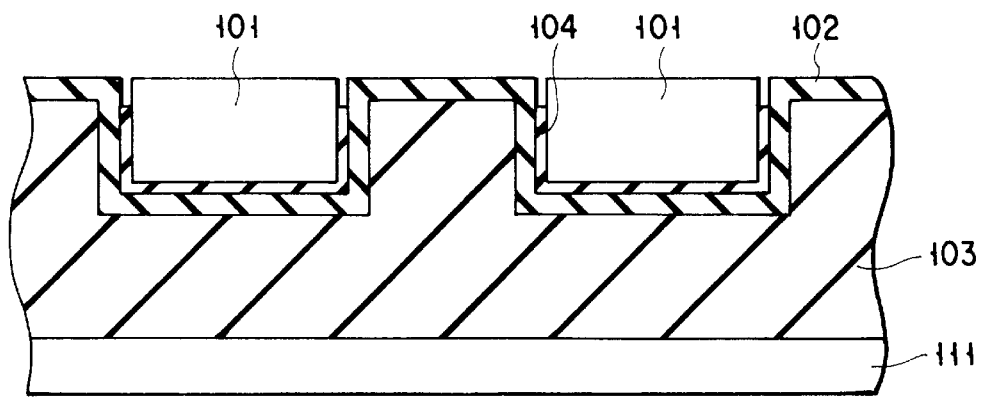
F I G. 9B
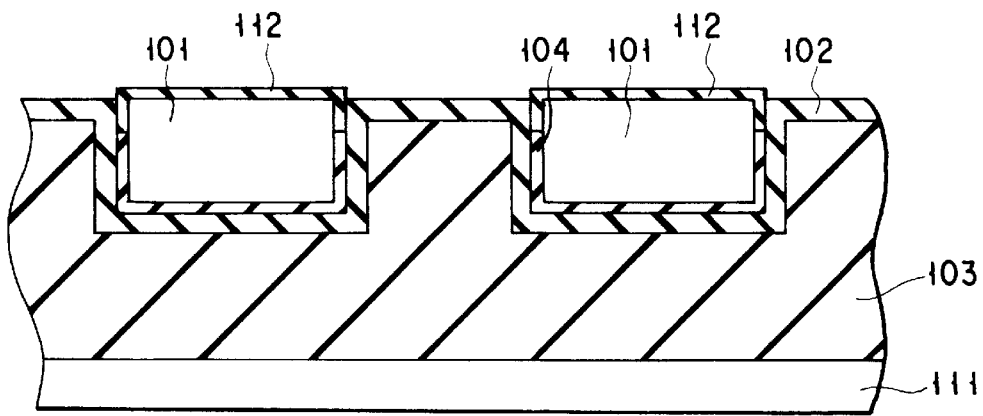
F I G. 9C

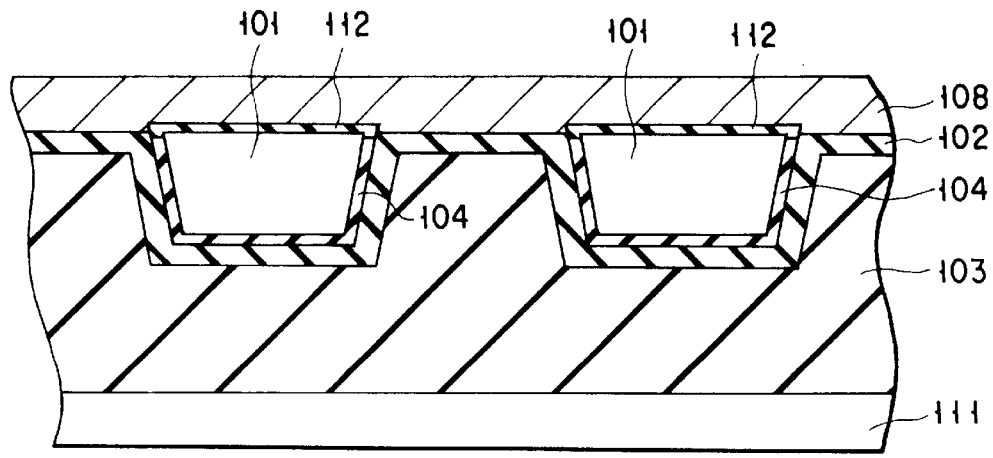
F I G. 10A
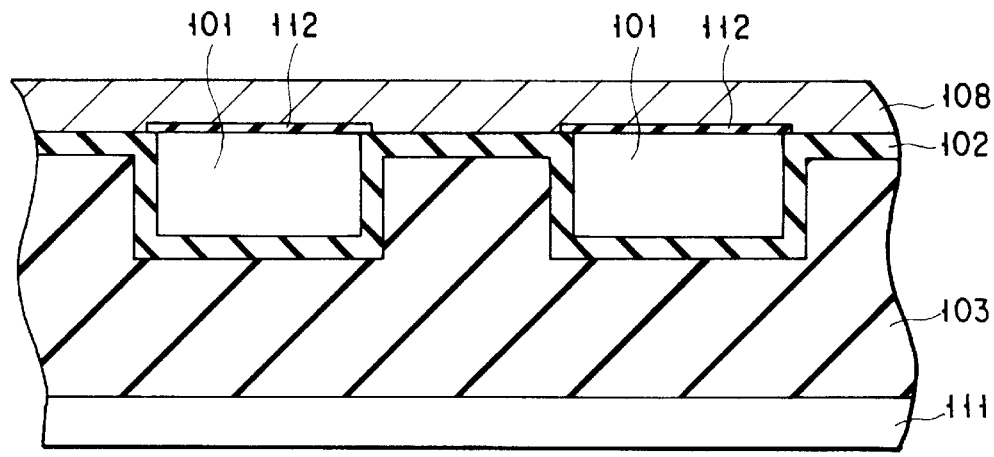
F I G. 10B
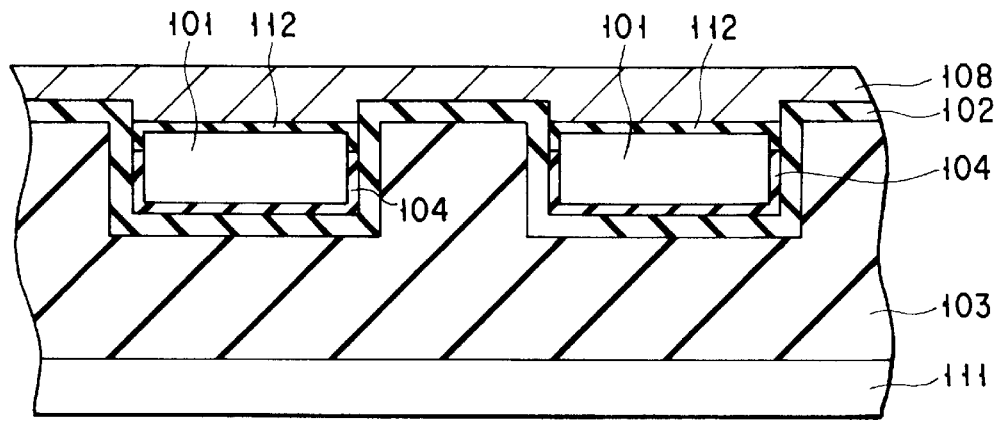
F I G. 10C

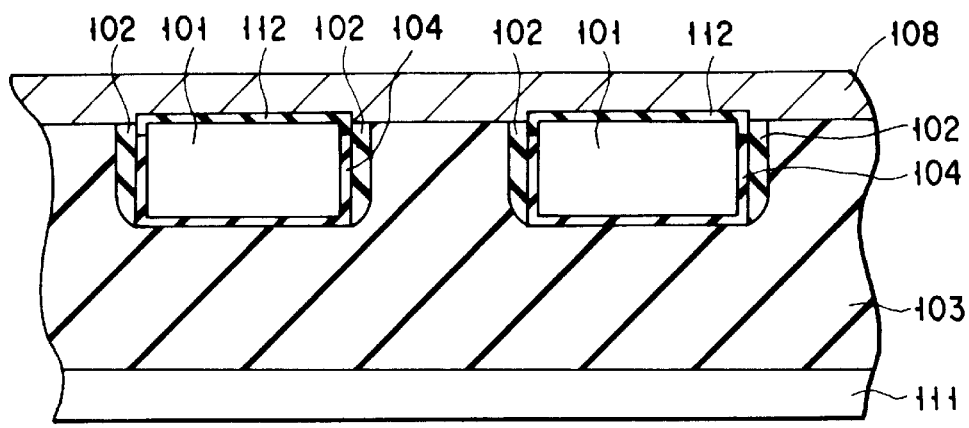
F I G. 11
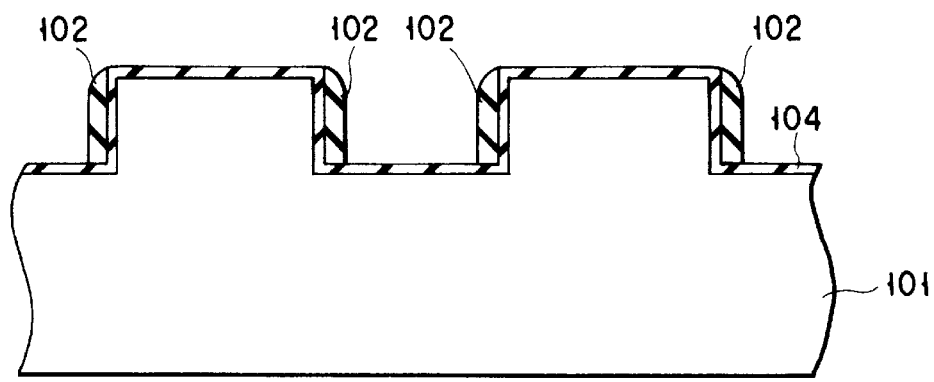
F I G. 12A
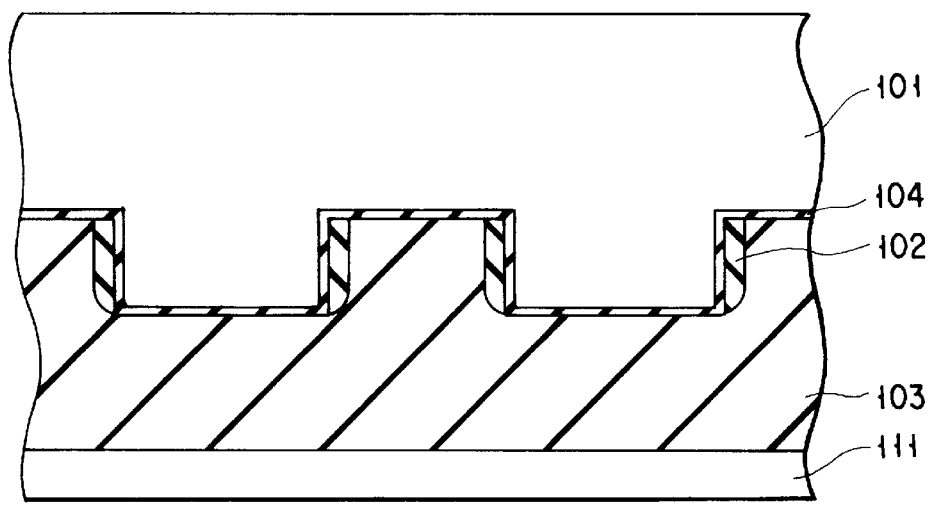
F I G. 12B

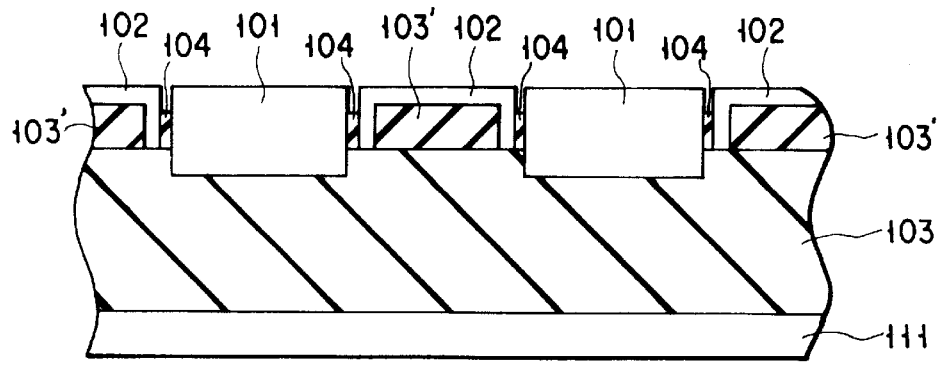
F I G. 15A
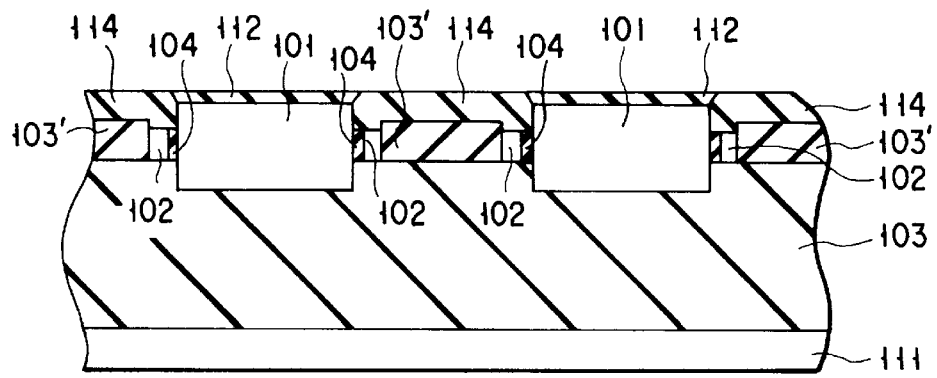
F I G. 15B
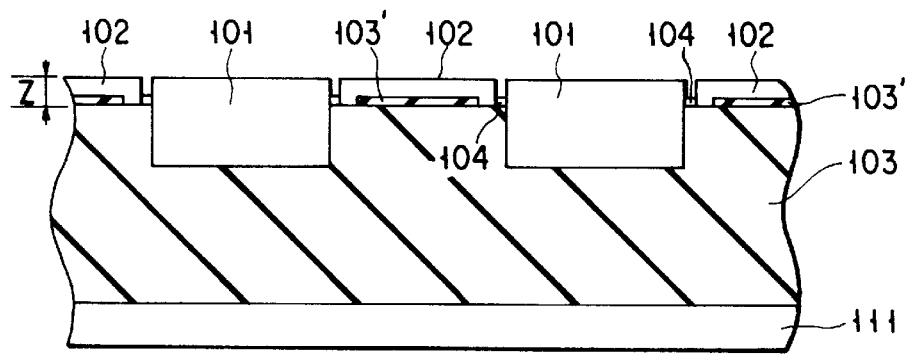
F I G. 16A
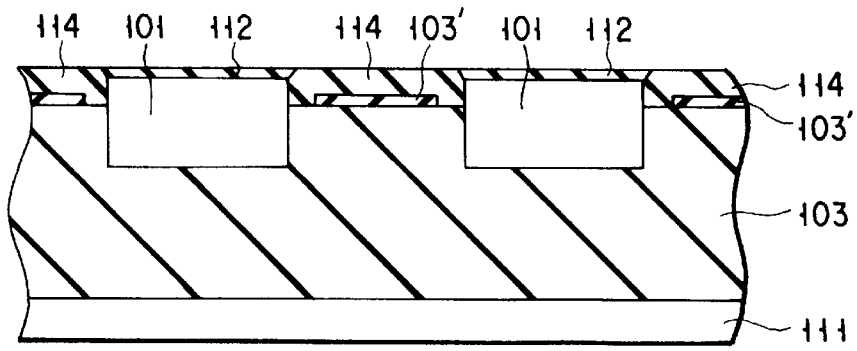
F I G. 16B

SEMICONDUCTOR DEVICE AND METHOD OF MANUFACTURE OF THE SAME

BACKGROUND OF THE INVENTION

1. Field of the Invention

The invention relates to a semiconductor device which is provided with a MIS (Metal Insulator Semiconductor) type of FET (Field Effect Transistor) in a trench-isolated region and a method of manufacturing the same.

2. Description of the Related Art

In recent years, to increase the packing density of semiconductor integrated circuits, the conventional LOCOS (Local Oxidation of Silicon) isolation has been replaced with the trench isolation which provides a high electrical isolation capability with insulating layers of narrower width. With the usual trench isolation structure, a single device isolation insulating layer is merely embedded in given locations in a semiconductor substrate. The use of this trench isolation structure for formation of a MISFET will result in such problems as described below.

Reference will be made to FIGS. 1A, 1B and 1C to describe the problems with a conventional flat type of MISFET using the trench isolation. FIG. 1A is a plan view of a MISFET, and FIGS. 1B and 1C are sectional views of the MISFET taken along the line 1B—1B and the line 1C–1C, respectively, of FIG. 1A. In these figures, reference numeral 1 denotes a semiconductor substrate, 3 a buried device isolation insulating layer, 8 a gate electrode, 9 a source/drain region, and 12 a gate insulating layer.

Conventionally, the gate insulating layer 12 is formed after the formation of the device isolation insulating layer 3 and the gate electrode 8 is subsequently formed over the gate insulating layer. In order to expose the surface of the semiconductor substrate 1 after the device isolation insulating layer 3 has been embedded, it is required to etch back the insulating layer. In this case, the insulating layer 3 is apt to be overetched, which will result in the surface of the insulating layer becoming lower than the exposed surface of the semiconductor substrate 1 as shown in FIG. 1B. Consequently, in a portion indicated at b, the edge of the semiconductor substrate 1 is exposed. A gate electric field will concentrate in this exposed portion when a transistor is formed and operated. Thus, the threshold voltage in the portion b becomes lower than in the flat portion a, resulting in a parasitic transistor being formed.

The ratio in conductance of the parasitic transistor to the transistor in the flat portion becomes large as the gate width decreases and each of these transistors will have a different threshold voltage. For this reason, with an integrated circuit in which there are formed a large number of transistors which are different in gate width, the generation of parasitic transistors will result in serious problems in circuit design.

In general, the shape of the semiconductor region and the device isolation region varies in the neighborhood of the parasitic transistor, depending on the amount of etching involved in preprocessing for the formation of the gate insulating layer and the trench shape. For this reason, the electrical characteristics of transistors vary, deteriorating the reproducibility of transistor characteristics.

As described above, the problem with the conventional trench isolation structure in which the device isolation insulating layer is made of a single layer is that parasitic transistors having their threshold voltages lowered are formed because preprocessing for the formation of the gate insulating layer in MISFETs overetches the device isolation insulating layer with the result that the insulating layer becomes lower than the semiconductor region and the edges of the semiconductor region are exposed.

SUMMARY OF THE INVENTION

It is an object of the invention to provide a semiconductor device which prevents edges of a semiconductor region from becoming exposed in preprocessing of forming a gate insulation layer to thereby reduce the effect of a parasitic edge transistor and ensure reproducibility of characteristics and a method of manufacturing the semiconductor device.

According to a first aspect of the invention there is provided a semiconductor device comprising: a semiconductor substrate having a major surface; a semiconductor region defined in the major surface and located between at least two trenches formed in the major surface; a first insulating layer formed on at least side walls of each of the trenches, the first insulting layer being formed of at least one layer; and a second insulating layer formed in a predetermined area of a surface of the semiconductor region, the second insulating layer contacting the first insulating layer, a thickness of a portion of the first insulating layer that is located at a top of the side walls of each of the trenches being larger than a thickness of the second insulating layer.

The first insulating layer preferably includes a layer of silicon nitride.

The semiconductor device preferably further comprises a third insulating layer that is embedded in each of the trenches with the first insulating layer interposed therebetween.

The semiconductor device may be modified to comprise: a semiconductor substrate having a major surface; a semiconductor region defined in the major surface and located between at least two trenches formed in the major surface; a first insulating layer formed on at least side walls of each of the trenches; a second insulating layer formed in a predetermined area of a surface of the semiconductor region, the second insulating layer contacting the first insulating layer; and a third insulating layer embedded in each of the trenches with the first insulating layer interposed therebetween, the first insulating layer having a height that reaches at least the major surface of the semiconductor substrate and a spacing between the first insulating layer and the side walls being set to be equal to or less than a thickness of the second insulating layer.

It is preferable that the first insulating layer comprises a silicon nitride layer serving as an etching stopper, and the third insulating layer comprises a silicon oxide layer adapted for device isolation.

It is preferable that the semiconductor device further comprises a fourth insulating layer formed between the first insulating layer and the side walls, and a thickness of the fourth insulating layer be equal to or less than the thickness of the second insulating layer.

It is preferable that the semiconductor device further comprise a conductive layer formed to overlie the first, the second and the third insulating layer.

The semiconductor device is a MISFET which includes the conductive layer as a gate electrode layer and the second insulating layer as a gate insulating layer.

According to a second aspect of the invention, there is provided a method of manufacturing a semiconductor device comprising the steps of: forming a plurality of trenches in a first surface of a semiconductor substrate; forming a buffer insulating layer and an etching stopper layer in sequence over the first surface of the semiconductor substrate formed with the trenches; depositing a device isolation insulating layer over the first surface of the semiconductor substrate; etching back the device isolation insulating layer, the buffer insulating layer, and the etching stopper layer until the first surface of the substrate is exposed to thereby bury the device isolation insulating layer in the trenches and leave the etching stopper layer at least on side walls of said trenches so that said etching stopper layer has a height that reaches at least at a height of the first surface of the substrate; and forming a gate insulating layer on a predetermined area of the first surface of the substrate which is disposed between at least two of the trenches so as to contact with the first buffer insulating layer.

The etching stopper layer preferably comprises a silicon nitride layer.

The manufacturing method preferably further comprises a step of forming a gate electrode on a gate insulating layer.

According to a third aspect of the invention there is provided a semiconductor device comprising: a base layer having a trench in a major surface thereof; a first insulating layer formed on at least side walls of the trench; a semiconductor region embedded in the trench with the first insulating layer interposed therebetween; and a second insulating layer formed in a predetermined area of a surface of the semiconductor region, the second insulating layer contacting the first insulating layer, the first insulating layer having a height that reaches at least said major surface of said base layer and a spacing between said first insulating layer and said side walls being set equal to or less than a thickness of the second insulating layer.

The first insulating layer preferably comprises a silicon nitride layer serving as an etching stopper.

It is preferable that the semiconductor device further comprise a third insulating layer formed between the first insulating layer and the side walls, a thickness of the third insulating layer being equal to or less than the thickness of the second insulating layer.

It is preferable that semiconductor device further comprise a conductive layer formed to overlie the first, the second and the third insulating layer.

The semiconductor device is a MISFET that comprises the conductive layer as a gate electrode and the second insulating layer as a gate insulating layer.

According to a fourth aspect of the invention there is provided a method of manufacturing a semiconductor device comprising the steps of: forming a plurality of trenches in a first surface of a semiconductor substrate; forming a buffer insulating layer and an etching stopper layer in sequence over the first surface of the semiconductor substrate formed with the trenches; depositing a device isolation insulating layer over the first surface of the semiconductor substrate; flattening a surface of the device isolation insulating layer and sticking a supporting substrate on the device isolation insulating layer; etching a second surface of the semiconductor substrate which is opposite to the first surface in which the device isolation region is defined until at least the etching stopper layer is exposed, thereby defining a device forming semiconductor region surrounded with the device isolation insulating layer; and forming a gate insulating layer on a predetermined area of an exposed surface of the device forming semiconductor region so that a part of the gate insulating layer contacts said buffer insulating layer.

The etching stopper layer preferably comprises a silicon nitride layer.

It is preferable that the manufacturing method preferably further comprises a step of forming a gate electrode on the gate insulating layer.

With the structure of the invention, even if the fourth insulating layer between the etching-preventive first insulating layer and the semiconductor substrate is etched by the preprocessing for the formation of the gate insulating layer, the etched portion is refilled with a new insulating layer formed when the MISFET gate insulating layer is formed. The edges of the semiconductor substrate will not come above the insulating layer. Thus, the effect of the edge parasitic transistor due to the formation of the gate electrode can be reduced.

Moreover, even if the etching depth of the fourth insulating layer varies during the preprocessing for the formation of the gate insulating layer, the shape between the MISFET and the device isolation insulating layer can be formed with stability because the deep etched portion of the fourth insulating layer is refilled with a new insulating layer when the gate insulating layer of the MISFET is formed.

Since the effect of the parasitic transistor is small, the threshold and subthreshold swing coefficient characteristics are realized which are uniform even between transistors which are different in gate width. Moreover, since the step size produced by the insulating layer etching at the time of gate lithography is small, the step between the semiconductor substrate surface and the trench is also reduced, permitting the gate shape which is good and uniform to be formed even if the depth of focus is shallow. Furthermore, since the gate electrode base has been formed with uniform height, the remnants of the subsequently formed gate electrode becomes difficult to remain, thereby preventing a short circuit caused by electrical connection between gate electrodes due to the remnants. This permits the use of a gate electrode material which is bad in coverage to form a gate electrode with uniform height. For this reason, a gate with uniform planar resistance can be formed.

The use of the manufacturing methods of the invention permits an insulating layer to be formed between the semiconductor substrate and the first insulating layer in the step of forming the gate insulating layer regardless of the amount of etching by the preprocessing for the formation of the gate insulating layer and the shape of the trenches, thereby preventing the effect of the edge parasitic transistors on the performance of MISFETs.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3A through 3F are sectional views illustrating the semiconductor device of the first embodiment in the order of steps of manufacture;

FIG. 4A shows, for a comparison with the semiconductor device of the invention, a semiconductor device in which the buffer insulating layer is relatively thick;

FIG. 4B shows the semiconductor device of the invention which is characterized in that the buffer insulating layer is thin;

FIG. 5 is a sectional view of a semiconductor device according to a second embodiment of the invention;

FIG. 6 is a sectional view of a semiconductor device according to a third embodiment of the invention;

FIGS. 9A, 9B and 9C are sectional views illustrating the semiconductor device of the fourth embodiment in the order of steps of manufacture;

FIGS. 10A, 10B and 10C are sectional views of modifications of the semiconductor device of the fourth embodiment;

FIG. 11 is a sectional view of a semiconductor device according to a fifth embodiment of the invention;

FIGS. 12A and 12B are sectional views illustrating the semiconductor device of the fifth embodiment in the order of steps of manufacture;

FIGS. 15A and 15B are sectional views illustrating the semiconductor device of the sixth embodiment in the order of steps of manufacture;

FIGS. 16A and 16B are sectional views illustrating a modification of the semiconductor device of the sixth embodiment in the order of steps of manufacture;

DETAILED DESCRIPTION OF THE PREFERRED EMBODIMENTS

[First Embodiment]

Figure 1A:
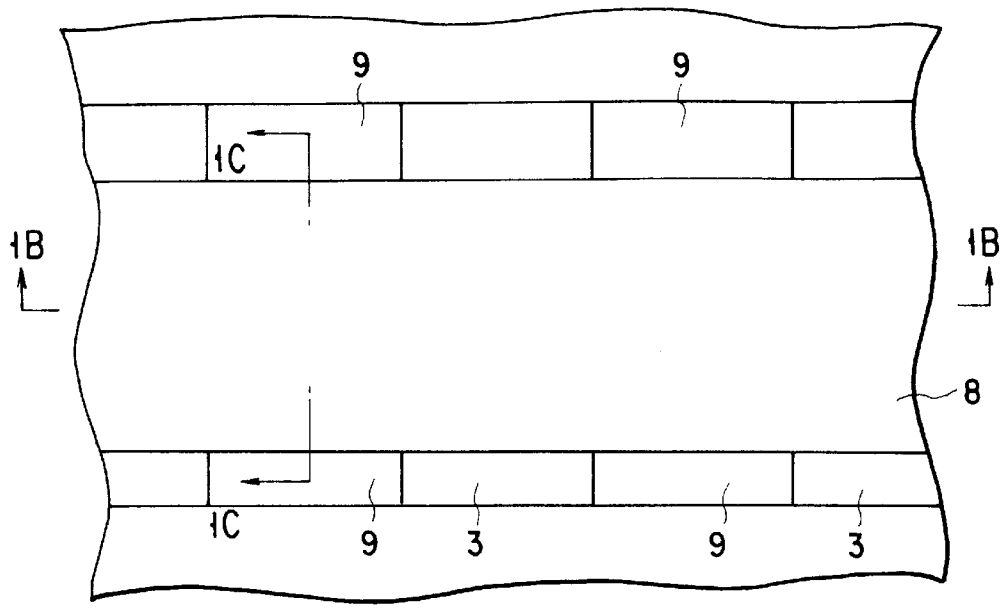
FIG. 1A is a plan view of a conventional semiconductor device.
Figure 1B:
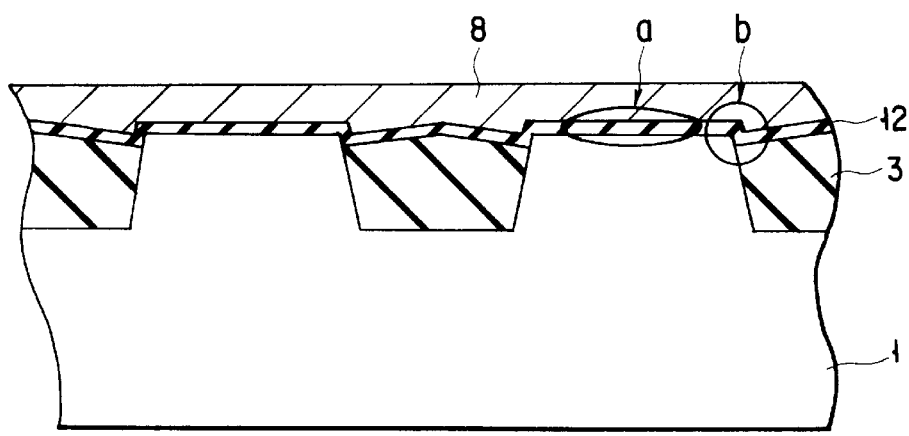
FIG. 1B is a sectional view taken along the line 1B—1B of FIG. 1A.
Figure 1C:
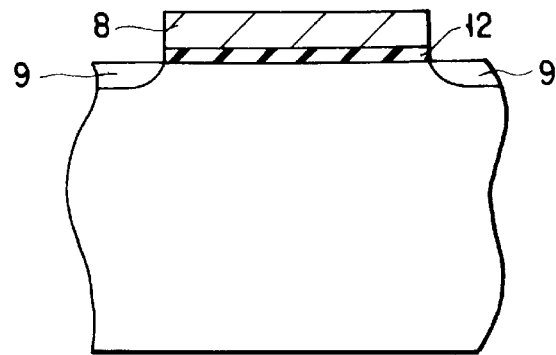
FIG. 1C is a sectional view taken along the line 1C—1C of FIG. 1A.
Figure 2A:
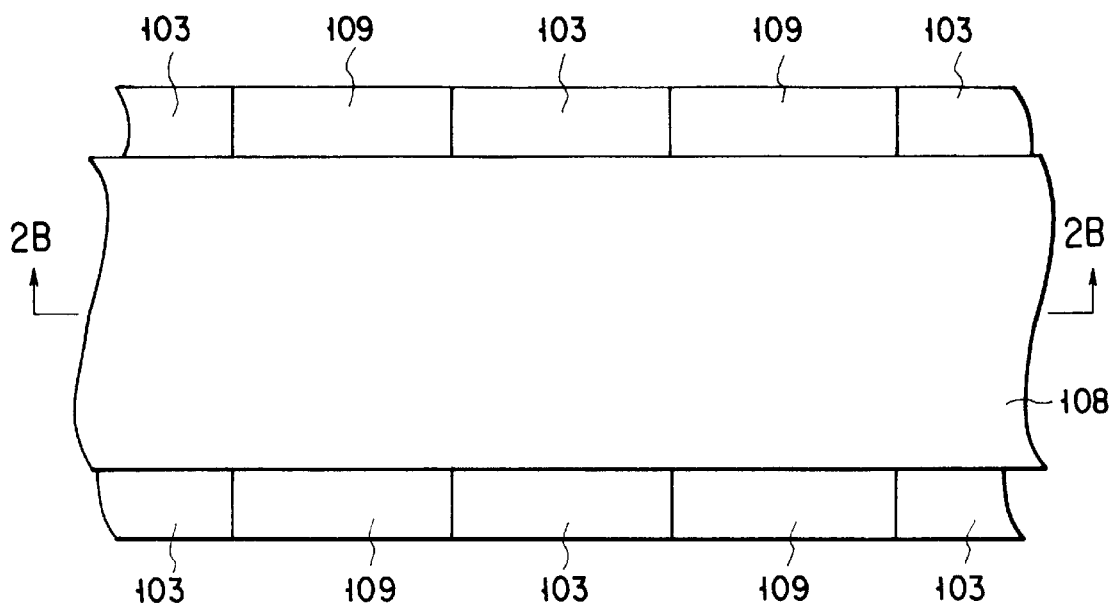
FIG. 2A is a plan view of a semiconductor device according to a first embodiment of the invention.
Figure 2B:
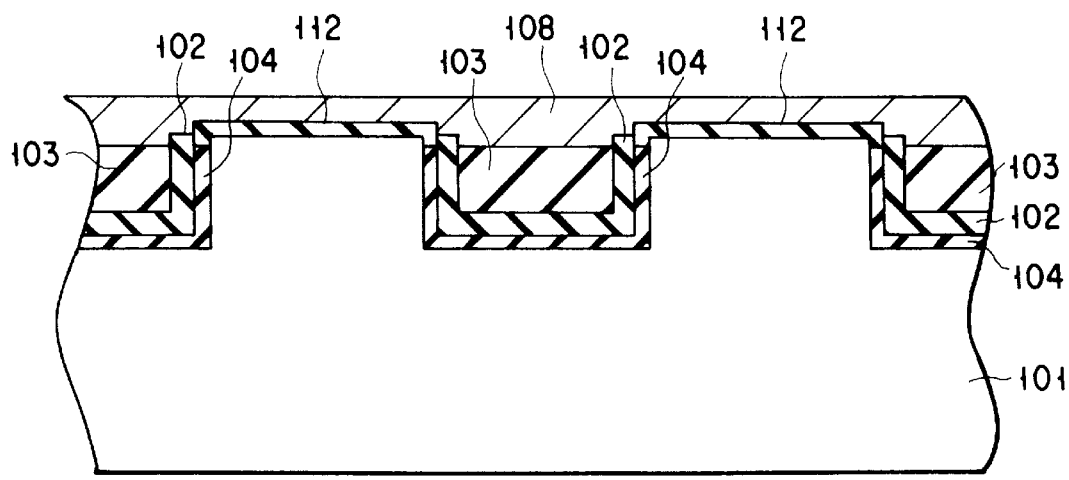
FIG. 2B is a sectional view taken along the line 2B—2B of FIG. 2A.

FIGS. 2A and 2B illustrate the structure of a semiconductor device according to a first embodiment of the invention. More specifically, FIG. 2A is a plan view of the semiconductor device and FIG. 2B is a sectional view taken along the line 2B—2B of FIG. 2A. Although two MISFETs are shown in these figures, this is merely exemplary. In semiconductor devices of the invention, one or more FETs are formed, including the following embodiments.

A trench is formed in a device isolation region of a semiconductor substrate 101. This trench is embedded with a device isolation insulating layer (third insulating layer) 103 with a buffer insulating layer (fourth insulating layer) 104 and an etching preventing insulating layer (first insulating layer) 102 interposed therebetween. A gate insulating layer (second insulating layer) 112 is formed on the surface of a device region surrounded with the trenches. Further, a gate electrode 108 is formed over the gate insulating layer 112 and each insulating layer in the trench. Source/drain regions 109 are formed on the opposite sides of the gate electrode 108 to thereby form a MISFET.

In FIG. 2, the edges of the device region of the semiconductor substrate 101, which are exposed to the trench, are covered with the insulating layer 104 or the insulating layer 102 so that the gate electrode 108 will not be located on the sidewalls of the trench with only the gate insulating layer 112 interposed therebetween.

Next, reference will be made to FIGS. 3A through 3F to describe the steps of manufacture of the semiconductor device shown in FIGS. 2A and 2B. FIGS. 3A through 3F are sectional views corresponding to FIG. 2B.

First, as shown in FIG. 3A, a trench is formed, by means of photolithographic and etching techniques, in that region of a p-type silicon substrate 101 of, for example, boron concentration of $10^{17}$ cm$^{-3}$ which is to be formed with a device isolation insulating layer. For example, the depth of the trench is in the range of 0.1 to 1.0 micrometers. After the formation of the trench, boron may be ion implanted into the bottom of the trench at a dose of $10^{12}$ to $10^{14}$ cm$^{-2}$ to prevent punch through.

Next, as shown in FIG. 3B, the surface of the semiconductor substrate 101 is oxidized to form the buffer insulating layer 104 of a thickness of 5 nm and a silicon nitride layer is then deposited over the buffer insulating layer as the insulating layer 102 serving as an etching stopper. The thickness of the insulating layer 102 is in the range of 10 to 200 nm. Incidentally, an etching stopper 102 may be formed by a silicon oxide layer. Further, as shown in FIG. 3C, the device isolation insulating layer 103 is deposited over the silicon nitride layer and its surface is then flattened. As the insulating layer 103, use is made of a PSG layer of a thickness of 0.3 to 1 micrometer. Annealing may be carried out on the insulating layer 103 at temperatures of 700 to 1000° C. which are high enough to melt it so that its thickness will become uniform.

Next, as shown in FIG. 3D, the insulating layer 103 is etched away from the entire surface, so that the surface of the semiconductor substrate 101 is exposed. If, at this point, the etching conditions are set such that the etching rate of the insulating layer 103 is lower than that of the insulating layer 104 or 102 and, after the etching, polishing is performed to flatten the entire surface, then it will become relatively easy to bury the insulating layer 103 in the semiconductor substrate 101. Of course, reactive ion etching may be used for the entire surface etching. In this case, after the entire surface etching is performed so that the insulating layer 102 will be left on the surface of the semiconductor substrate, selective etching may be performed to remove the insulating layer 102.

Next, the semiconductor substrate 101 is subjected to a cleaning process prior to the formation of a gate insulating layer 112. At this step, the insulating layer 104 may be subjected to etching so that its top surface comes below the top surface of the substrate as shown in FIG. 3E. For the insulating layer 102, however, use is made of a material which is hard to be etched by the cleaning process. That is, the top of the insulating layer 102 is kept flush with or higher than the surface of the semiconductor substrate.

Next, preprocessing etching for the formation of the gate insulating layer 112 is carried out. The gate insulating layer is then formed as shown in FIG. 3F. The layer is formed by means of oxidation of the substrate surface at a thickness of 5 to 50 nm. At this point, the gap between the insulating layer 102 and the semiconductor substrate 101, which was made by etching the insulating layer 104 at the step of cleaning, can be refilled with the gate insulating layer 112 by keeping the spacing between the insulating layer 102 and the semiconductor substrate (i.e., the width of the gap) 101 below the thickness of the gate insulating layer 112.

Though not shown, in the following steps, a layer of polysilicon which serves as the gate electrode 108 is deposited over the entire surface and then subjected to diffusion of, for example, $POCl_3$ to lower its resistance. The polysilicon layer is then patterned by means of lithographic and etching techniques to form the gate electrode 108. After that, the side walls of the gate electrode may be oxidized to a thickness of 5 to 50 nm in an oxygen ambient for example.

After that, phosphorus or arsenic is ion implanted into the semiconductor substrate at a dose of $10^{13}$ to $10^{16}$ $cm^{-2}$ to form the n-type source and drain regions 109, thereby obtaining the structure shown in FIG. 2B.

The semiconductor device thus constructed provides the following four features.

(1) The insulating layer 102, serving as an etching stopper, is formed over the entire surface and the device isolation insulating layer is then formed to bury the trench. After that, the entire surface etching is performed to expose the surface of the substrate 101, thereby leaving the etching stopper only in the trench. Thus, the need of patterning the etching stopper layer 102 is eliminated, which makes the manufacturing steps easy and causes no misalignment problem.

(2) A layer that has a blocking capability against an oxidation-reduction agent such as oxygen, hydrogen, or steam is used as the etching stopper layer 102 and formed to cover the inside of the trench, thereby avoiding changes in the shape of the semiconductor substrate 101 due to the oxidation-reduction agent after the formation of the etching stopper layer 102.

(3) The semiconductor substrate 101 serves as the supporting substrate. Thus, there arises no substrate floating effect of causing a threshold shift or deterioration due to hole accumulation as in a semiconductor region formed on an insulating layer, permitting substrate bias application.

(4) The buffer insulating layer 104 is made thinner than the gate insulating layer 112. Therefore, even if the buffer insulating layer is etched back, it is made up for at the time when the gate insulating layer is formed, preventing the edge portions of the substrate from being exposed. In addition, at the top of the trench, the thickness of the insulating layers including the etching stopper layer 102 becomes larger than that of the gate insulating layer 112, further alleviating the concentration of electric field at the edge portions of the substrate. This advantage will be discussed below in more detail.

Suppose here that buffer insulating layer 104' is formed thick as shown in FIG. 4A. When the gate insulating layer 112 is formed on the substrate 101, there is produced that portion of the surface of the insulating layer 104' which is not covered with the gate insulating layer in the neighborhood of the boundary between the trench and the substrate as shown in the circle indicated at c. When the gate electrode 108 is formed, therefore, the edge portion of the substrate will be opposed to the gate electrode 108 with only the gate insulating layer 112 interposed therebetween. Thus, a strong electric field will be produced in that portion when the transistor is operated.

In the present invention, on the other hand, since the thickness of the buffer insulating layer 104 is made less than that of the gate insulating layer 112, even if the edge portion of the substrate is rounded and hence the gap between the substrate and the trench becomes widened, the gap will be filled with oxide when the insulating layer 112 is formed. Therefore, it becomes possible to prevent the gate electrode 108 from directly contacting the buffer insulating layer 104 as shown in the circle indicated at d in FIG. 4B. For this reason, the concentration of electric field at the edge portion of the substrate is alleviated.

[Second Embodiment]

FIG. 5 is a sectional view of a semiconductor device according to a second embodiment of the invention. In this figure, like reference numerals are used to denote corresponding parts to those in FIGS. 2A and 2B and their description will be omitted. The same applies to other embodiments which will be described later.

The second embodiment remains basically unchanged from the first embodiment, but is distinct from the first embodiment in the shape of and the method of formation of the etching stopper layer 102. In the present embodiment, as shown in FIG. 5, the etching stopper layer 102 is not formed on the bottom of the trench, but is left only on the side walls of the trench. This structure can be implemented by etching the etching stopper layer 102 by means of RIE in a direction perpendicular to the substrate surface.

After that, the device isolation insulating layer 103 is deposited and then the entire surface etching of that insulating layer and the preprocessing etching for the formation of the gate insulating layer 112 are performed in sequence. Subsequently, the gate insulating layer 112 is formed and the gate electrode 108 is then formed. The steps after the formation of the gate electrode are the same as those in the first embodiment and hence their description is omitted.

Even with the structure of the second embodiment in which the etching stopper layer 102 is formed only on the side walls of the trench, the features (1), (3) and (4) described in connection with the first embodiment are preserved. Moreover, in the second embodiment, the stress applied to the substrate 101 can be made smaller than in the first embodiment in which the layer 102 is formed on the bottom of the trench as well. Furthermore, the thermal distortion, which is due to the difference in thermal expansion coefficient between the etching stopper layer 102 and the semiconductor substrate 101 or between the etching stopper layer and the insulating layer 103, can be decreased.

[Third Embodiment]

FIG. 6 is a sectional view of a semiconductor device according to a third embodiment of the invention.

The third embodiment remains basically unchanged from the second embodiment, but is distinct from the second embodiment in the shape of the etching stopper layer 102 and the method of forming the same. In the present embodiment, the etching stopper layer 102', which is made of, for example, polycrystalline silicon, is formed and subjected to oxidation or nitriding when the gate electrode is formed, so that an insulating layer 114 is formed. The insulating layer 103 is embedded in the semiconductor substrate 101 with the layer 102' and the insulating layer 104 interposed therebetween. The layer 102' is formed on top with the insulating layer 114 to serve as a device isolation insulating layer.

In FIG. 6, the edges of the substrate exposed to the trench are protected by the insulating layer 114 or 104, preventing the gate electrode 108 from being located with respect to the side walls of the trench with only the gate insulating layer 112 interposed therebetween.

In the present embodiment, the surface of the semiconductor substrate 101 formed with the trench is oxidized to form the insulating layer 104 of a thickness of, for example, 10 nm and the etching stopper layer 102' made of, for example, polysilicon is then deposited on the surface of the substrate at a thickness of 10 to 200 nm. The layer 102' is then subjected to vertical etching by means of RIE, so that the layer 102' is left only on the side walls of the trench. Next, the insulating layer 103 is deposited over the entire surface. As the insulating layer 103, a PSG layer of a thickness of, for example, 0.3 to 1 micrometer is used. $N_2$ annealing at temperatures 700 to 1000° C. which are high enough to melt the layer 103 may be added to make its thickness uniform.

Figure 7A:
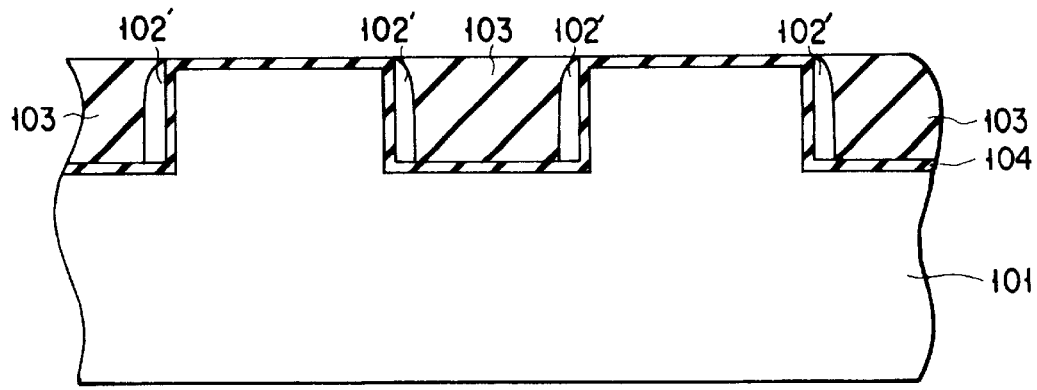
FIGS. 7A, 7B and 7C are sectional views illustrating the semiconductor device of the third embodiment in the order of steps of manufacture.

Next, as shown in FIG. 7A, the insulating layer 103 is etched away from the entire surface of the substrate to expose the insulating layer 104 or the semiconductor substrate 101. In this case, if the etching conditions are set such that the etching rate of the insulating layer 104 or the semiconductor substrate 101 is low in comparison with that of the insulating layer 103, and the resulting entire surface is flattened by polishing, then the insulating layer 103 can be embedded in the semiconductor substrate 101 relatively easily. Of course, the RIE method may be used instead to etch the insulating layer 103.

Figure 7B:
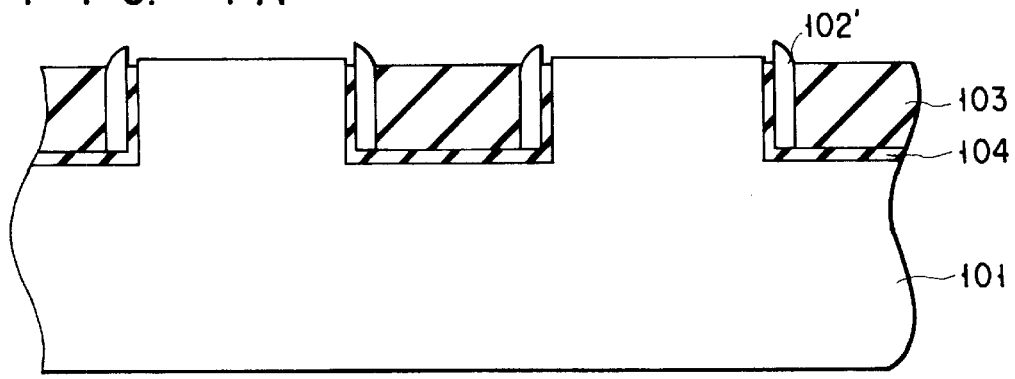

Next, the semiconductor substrate 101 is subjected to cleaning prior to the formation of the gate insulating layer 112. At this point, the insulating layer 104 may be etched by cleaning so that it comes below the surface of the substrate as shown in FIG. 7B. However, the layer 102' is formed of a material that is hard to be etched by cleaning so that its top will not come below the substrate surface.

Figure 7C:
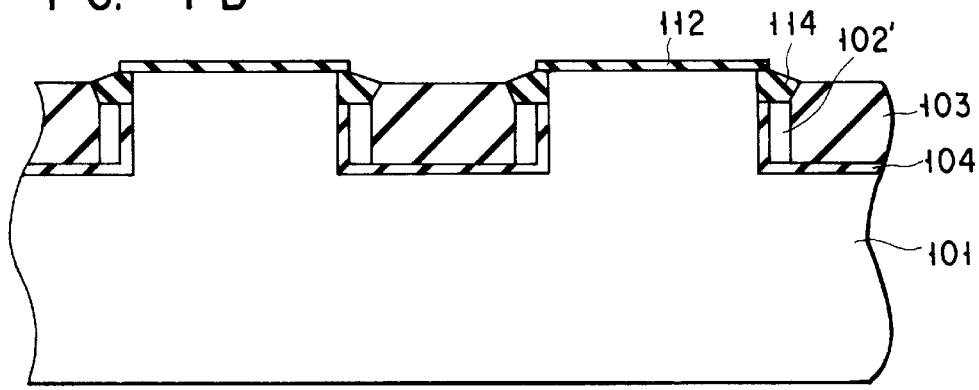

Next, as shown in FIG. 7C, the gate insulating layer 112 is formed. For example, the gate insulating layer consists of an oxide layer or nitride layer and its thickness is in the range of 5 to 50 nm. At the time of the formation of the gate insulating layer 112, the top of the layer 102' is also oxidized or nitrided into an insulating layer 114. By keeping the spacing between the etching stopper layer 102' and the semiconductor substrate 101 below the sum of the thickness of the gate insulating layer and an increase in the thickness of the layer 102' due to its conversion into insulating layer 114, the loss of the top portion of the insulating layer 104 due to etching by cleaning can be made up for by the gate insulating layer 112 and the insulating layer 114.

After that, the subsequent steps including the formation of the gate electrode 108 are performed. These steps are identical to the corresponding steps in the first embodiment.

The following five features are provided by the present embodiment.

(1) The etching stopper layer 102 is formed only in the trenches other than semiconductor regions. Thus, the need of patterning the etching stopper layer 102 is eliminated, which makes the manufacturing steps easy and causes no misalignment problem in principle.

(2) The semiconductor substrate 101 serves as the supporting substrate. Thus, there arises no substrate floating effect of causing a shift or deterioration in threshold due to hole accumulation as in a semiconductor region formed on an insulating layer, permitting substrate bias application.

(3) The insulating layer 114 is formed by oxidizing or nitriding the layer 102'. Even if the spacing between the layer 102' and the substrate 101 is set equal to the sum of the thickness of the gate insulating layer 112 and an increase in the thickness of the layer 102' due to oxidation or nitriding, the loss of the top portion of the layer 104 can be made up for. This means that the layer 104 can be made thicker. Thus, even if use is made of the layer 103 that has a larger leakage current or a smaller breakdown voltage than the layer 104, the dielectric characteristics can be maintained by making the layer 104 thicker. Further, even if the layer 103 or 102 is charged, the effect on the semiconductor substrate can be decreased by making the layer 104 thicker.

(4) The layer 102' is formed only on the side walls of the trench in the semiconductor substrate. Thus, the stress applied to the substrate and the thermal distortion due to the difference in thermal expansion coefficient, which were described in connection with the second embodiment, can also be decreased in comparison with the first embodiment.

(5) The feature of the first embodiment in which the thickness of the insulating layer at the top of the trench becomes larger than the thickness of the gate insulating layer 112 is also preserved.

[Fourth Embodiment]

Figure 8:
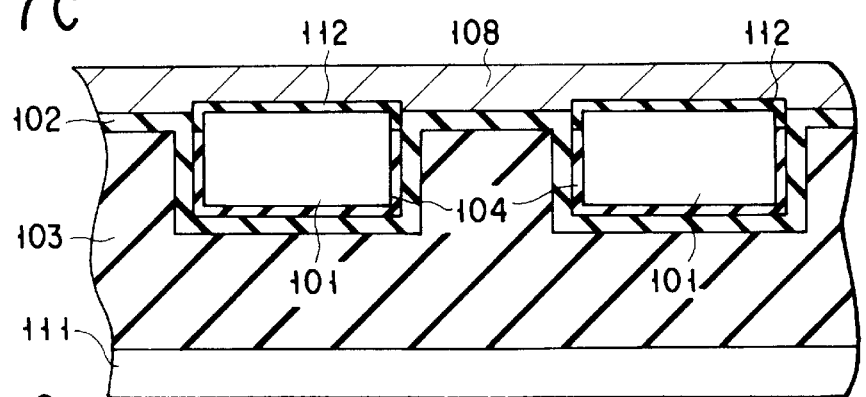
FIG. 8 is a sectional view of a semiconductor device according to a fourth embodiment of the invention.

FIG. 8 is a sectional view of a semiconductor device according to a fourth embodiment of the invention.

In the fourth embodiment, unlike the first embodiment, semiconductor regions 101 are separated from a supporting substrate.

A transistor is formed on a p-type semiconductor region 101 and a gate electrode 108 is formed over the semiconductor region 101 with a gate insulating layer 112 interposed therebetween. As in the first embodiment, n-type regions 109 are formed on the opposite sides of the gate electrode to serve as the source and drain of a planar MOS transistor (see FIG. 2A).

The semiconductor region 101 is embedded in an insulating layer (base layer) 103 with insulating layers 104 and 102 interposed therebetween. The insulating layer 103 functions as a device isolation insulating layer. The semiconductor region 101 is formed over the supporting substrate 111 with the insulating layer 103 interposed therebetween. In this case, the edges of the semiconductor region 101 in FIG. 7 are protected by the insulating layers 104 and 102, preventing the gate electrode 108 from being located with respect to the side walls of the semiconductor region with only the gate insulating layer 112 interposed therebetween.

The formation of the structure in the present embodiment starts with the same steps as the first embodiment. That is, as described in connection with FIGS. 3A to 3C, the surface of the semiconductor substrate 101 formed with trenches is first oxidized to form the insulating layer 104 of a thickness of 5 nm, and then the insulating layer 102 serving as the etching stopper, for example, a silicon nitride layer, is deposited at a thickness of 10 to 200 nm and the insulating layer 103 is deposited over the entire surface.

The resultant structure is stuck on the substrate 111 with the insulating layer 103 downward as shown in FIG. 9A. As the insulating layer 103, use is made of a PSG layer of a thickness of, for example, 1 to 2 micrometer. After the deposition of the insulating layer 103, the structure may be subjected to annealing in an $N_2$ ambient or in a steam ambient so as to flatten the surface of the insulating layer. After sticking, the structure may be subjected to annealing in an $N_2$ ambient or in a steam ambient so as to increase the adhesion.

Next, as shown in FIG. 9B, the semiconductor region 101 is etched away from its surface to expose the insulating layer 104 or 102. In this case, the etching conditions are set such that the etching rate of the insulating layer 104 or 102 is lower than that of the semiconductor substrate 101, and the entire surface is flattened by polishing after the etching, thus permitting the semiconductor region 101 to be embedded in the insulating layer 103. Of course, in this case, ion etching may be used instead of polishing.

Next, the semiconductor region 101 is subjected to cleaning prior to the formation of gate insulating layer 112. At this point, the insulating layer 104 may be etched so that it comes below the surface of the semiconductor region 101 as shown in FIG. 9B. However, the insulating layer 102 is made of a material that is hard to be etched by cleaning so that it will not come below the surface of the semiconductor region.

A gate insulating layer ($SiO_2$) 112 is formed on the surface of the semiconductor region 101 by means of oxidation as shown in FIG. 9C. The thickness of that layer is in the range of 5 to 50 nm. In this case, the loss of the top of the insulating layer 104 caused by etching at the time of polishing can be made up for by keeping the spacing between the second insulating layer 102 and the semiconductor region 101 below the thickness of the gate insulating layer.

After that, polysilicon is deposited over the entire surface of the structure. Impurities of, for example, $POCl_3$ are then implanted into the polysilicon layer to lower its resistance. The polysilicon layer is patterned by means of lithographic and etching techniques to form the gate electrode 108. After that, the side walls of the gate electrode may be oxidized in an oxygen ambient to form an oxide layer of a thickness of 5 to 50 nm.

Further, phosphorous or arsenic is ion implanted at a dose of $10^{13}$ to $10^{16}$ $cm^{-2}$ to form n-type source and drain regions 109, whereby the structure shown in FIG. 8 is obtained.

The present embodiment may be modified such that, as shown in FIG. 10A, the trench is formed tapered, not vertically. Of course, the trench may be formed reverse-tapered. As another modification, the insulating layer 102 may be formed directly on the semiconductor region 101 without forming the insulating layer 104.

As shown in FIG. 10C, the surface of the semiconductor region 101 may be located below the insulating layer 102. In this case, the effect of edge parasitic transistors can be lessened because the edges of the semiconductor region are not surrounded with the gate electrode 108. This structure is obtained by further etching the semiconductor region after it has been etched away from the entire surface to expose the insulating layer 104 or 102.

The present embodiment has the following four features.

(1) After the formation of the etching stopper layer 102, the substrate is reversed for the formation of transistors. Thus, the etching stopper layer is formed on the surface of the insulating layer 103 including the inside of the trench. This eliminates the need of patterning the layer 102, making the manufacturing steps easy and causing no misalignment problem in principle.

(2) By using a deposited layer that has a good coating property (coverage) for the device isolating insulating layer 103, the layer 103 can be formed over the insulating layer 102 with good uniformity. Thus, a seam, which becomes a problem when the layer 103 is formed buried from the top surface, will not be produced in the neighborhood of the interface between the device isolation insulating layer 103 and the insulating layer 102. Thus, the good shape of the device isolation insulating layer 103 can be maintained even in etching and heating steps after the formation of the gate insulating layer.

(3) A material that has a blocking capability against an oxidation-reduction agent, such as oxygen, hydrogen, or steam, is used as the etching stopper layer 102 and the layer 102 is formed over the entire sides of the semiconductor region 101 and the entire surface of the insulating layer 103. Therefore, it becomes possible to prevent changes in the shape of the semiconductor region 101 and the device isolation insulating layer 103 due to the oxidation-reduction agent after the formation of the gate insulating layer.

(4) The semiconductor region 101 is completely buried in the insulating layer 102, which, like the previous embodiments, helps alleviate the electric field concentration at the edges of the semiconductor region.

[Fifth Embodiment]

FIG. 11 is a sectional view of a semiconductor device according to a fifth embodiment of the invention.

This embodiment remains basically unchanged from the fourth embodiment, but differs from the fourth embodiment in the shape of and the method of formation of the etching stopper layer 102. In the present embodiment, the etching stopper layer 102 is left only on side walls of the trench in the semiconductor region 101 as shown in FIG. 12A. This is achieved by first forming the etching stopper layer over the entire surface and then etching that layer vertically with respect to the surface by means of RIE. Moreover, the insulating layer (base layer) 103 is deposited and the resulting structure is then stuck on the supporting substrate 111 with the insulating layer 103 downward as shown in FIG. 12B. Furthermore, the etching of the semiconductor substrate 101 and the preprocessing etching for the formation of the gate insulating layer 112 are performed in sequence. These steps are identical to the corresponding steps in the fourth embodiment.

In the present embodiment, the etching stopper layer 102 is left only on the side walls of the semiconductor region 101, thus achieving less stress than in the fourth embodiment. In addition, the thermal distortion due to the difference in thermal expansion coefficient between the etching stopper layer and the semiconductor region or between the etching stopper layer and the insulating layer 103 can also be decreased. Of course, the features (1), (2) and (4) of the fourth embodiment are preserved.

Figure 13:
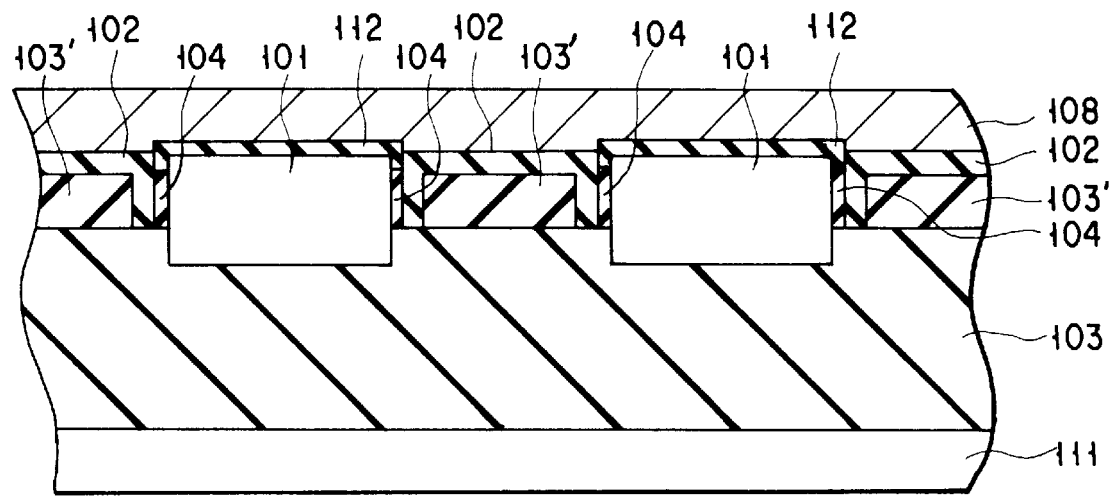
FIG. 13 is a sectional view of a modification of the semiconductor device of the fifth embodiment.

As a modification of the fifth embodiment, the etching stopper layer 102 may be left not only on the side walls but also on the device isolation region between the semiconductor regions 101 as shown in FIG. 13. The structure of FIG. 13 is obtained by first depositing the insulating layer 102 over the entire surface as shown in FIG. 3B, then depositing the insulating layer 103' over the entire surface, and finally etching or polishing the insulating layers 103' and 102 so that they will not be left on the semiconductor region 101. After that, the insulating layer 103 is deposited. The subsequent steps are identical to the corresponding steps in the fourth embodiment.

With the structure of FIG. 13, the features (1), (2) and (4) of the fourth embodiment are preserved. In the structure thus constructed, since the insulating layer 102 is not formed below the semiconductor region 101, the layer stress and the thermal distortion due to the difference in thermal expansion coefficient can be lowered in comparison with the fourth embodiment.

[Sixth Embodiment]

Figure 14:
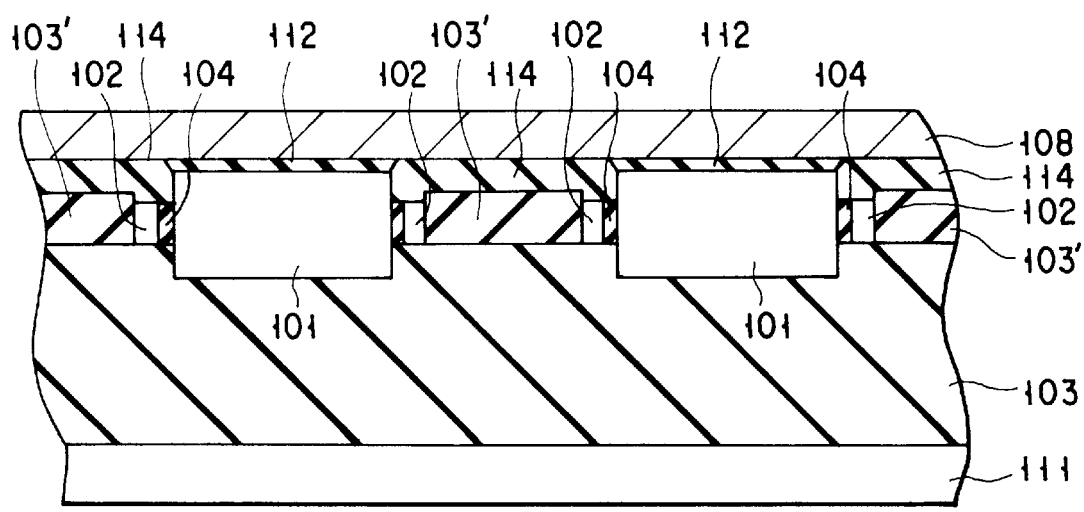
FIG. 14 is a sectional view of a semiconductor device according to a sixth embodiment of the invention.

FIG. 14 is a sectional view of a semiconductor device according to a sixth embodiment of the invention.

This embodiment remains basically unchanged from the third embodiment, but differs from the third embodiment in that the semiconductor region 101 is buried in the insulating layers (base layers) 103 and 103' and in the method of formation. In this embodiment as well, as shown in FIG. 14, the edges of the semiconductor region are protected by the insulating layer 114 or 104, preventing the gate electrode 108 from being located over the side walls of the semiconductor region with the gate insulating layer 112 interposed therebetween.

In the present embodiment, the surface of the semiconductor substrate 101 that is formed with trenches as shown in FIG. 3A is oxidized to form the insulating layer 104 to a thickness of 5 nm and, as the etching stopper layer 102, a polysilicon layer is then deposited to a thickness of 0.1 micrometer. Then, the insulating layer 103' is deposited over the entire surface. As the insulating layer 103', use is made of a PSG layer of a thickness of 0.3 to 1 micrometer. The insulating layer 103' may be subjected to annealing at 700 to 1000° C. to thereby make its thickness uniform.

The insulating layers 102 and 103' are etched until the surface of the semiconductor region 101 is exposed. By this etching operation, the insulating layer 102 is left in each device isolation region. In this case, the etching conditions are set such that the etching rate of the insulating layer 103' or 102 is higher than that of the semiconductor substrate 101, thereby allowing the semiconductor region to be buried in the insulating layer 103 relatively easily. At this point, the insulating layer 104 may be etched.

After the insulating layer 103 is deposited over the entire surface, the resulting structure is stuck on the supporting substrate 111 with the insulating layer 103 opposed to the substrate. As the insulating layer 103, use is made of a PSG layer of a thickness of 0.3 to 1 micrometer. After being stuck, the structure may be subjected to annealing in an N₂ ambient so as to increase the sticking strength.

Next, the semiconductor substrate 101 is subjected to entire surface etching from its surface (the side opposite to the supporting substrate 111) to expose the insulating layer 104 or 102. In this case, the etching conditions are set such that the etching rate of the insulating layer 104 or 102 is lower than that of the semiconductor substrate 101 and the entire surface is flattened by polishing after the etching, thus permitting the semiconductor region 101 to be embedded in the insulating layer 103. Of course, for entire surface etching, ion etching may be used instead of polishing.

Next, the semiconductor region 101 is subjected to cleaning prior to the formation of gate insulating layer 112. At this point, the insulating layer 104 may be etched so that it will come below the surface of the semiconductor region 101 as shown in FIG. 15A. However, the insulating layer 102 is made of a material that is hard to be etched by cleaning so that it will not come below the surface of the semiconductor region.

The gate insulating layer (SiO₂) 112 is formed on the surface of the semiconductor region 101 by means of oxidation or nitriding as shown in FIG. 15B. The thickness of that layer is selected to be 5 to 50 nm. By oxidation or nitriding, the top of the etching stopper 102 is converted into insulating layer 114. In this case, the loss of the top of the insulating layer 104 caused by etching at the time of polishing can be made up for by keeping the spacing between the etching stopper layer 102 and the semiconductor region 101 below the sum of the thickness of the gate insulating layer 112 and an increase in the thickness of the etching stopper 102 due to its conversion to an insulating layer.

After that, the steps following the formation of the gate electrode 108 are performed. These steps are identical to the corresponding respective steps in the first embodiment.

The present embodiment has the following advantage in addition to the features (1) and (3) in the third embodiment. That is, by using a deposited layer that has a good coating property (coverage) for the device isolating insulating layer 103', the layer 103 can be formed over the insulating layer 103' with good uniformity as shown in FIG. 14. Thus, a seam, which becomes a problem when the layer 103 is formed buried from the top surface, will not be produced in the neighborhood of the interface between the device isolation insulating layer 103' and the insulating layer 102. Thus, the good shape of the device isolation insulating layer 103 can be maintained even after etching and heating steps following the formation of the gate insulating layer.

FIGS. 16A and 16B show a modification of the sixth embodiment. In etching the etching stopper layer 102 prior to the deposition of the insulating layer 103 in FIG. 15A, the thickness of the layer 102 remaining after etching (indicated at Z in FIG. 16A) is selected to be equal to a thickness that permits the layer 102 to be converted to an insulating layer, i.e., the depth at which the layer 102 can be oxidized, or less. In this case, as shown in FIG. 16B, the layer 102 is all converted to insulating layer 114 when the gate insulating layer 112 is formed. If, therefore, the insulating layer 114 is lower in electrical conductivity than the layer 102, then the device isolation characteristic will be improved further.

[Seventh Embodiment]

Figure 17:
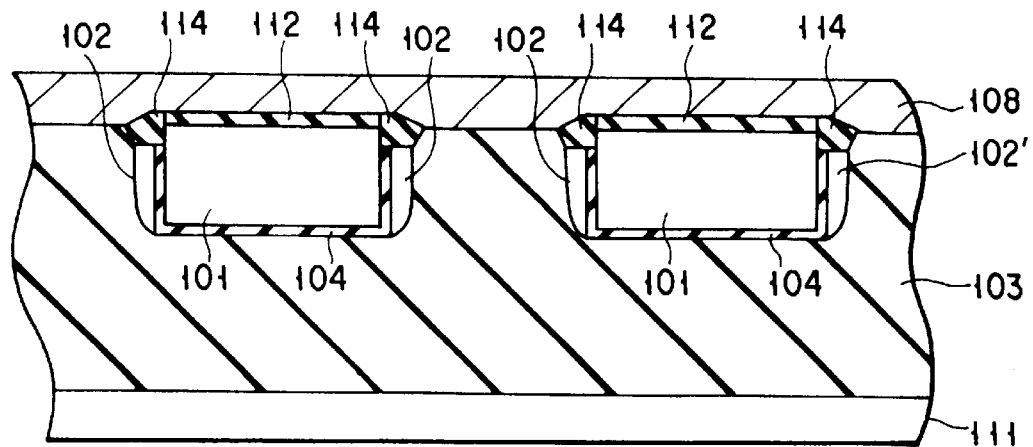
FIG. 17 is a sectional view of a semiconductor device according to a seventh embodiment of the invention.

FIG. 17 is a sectional view of a semiconductor device according to a seventh embodiment of the invention.

This embodiment remains basically unchanged from the third embodiment, but differs from the third embodiment in that the semiconductor region 101 is buried in the insulating layer (base layer) 103.

In this embodiment, as shown in FIG. 17, the layer 102 is formed only on the side walls of the semiconductor region 101 and the insulating layer 114 is not formed over the device isolation insulating layer 103. That is, after the layer 102 is deposited, it is etched vertically with respect to the surface by means of RIE, whereby the etching stopper layer is left only on the side walls of the trench. Then, the insulating layer 103 is deposited over the entire surface. As the insulating layer 103, a PSG layer of a thickness of 0.3 to 1 micrometer is used. After that, the structure may be subjected to annealing at 700 to 1000° C. to make the thickness of the layer 103 uniform. The resulting structure is stuck on the supporting substrate 111 with the insulating layer 103 opposed to the substrate. The subsequent steps are identical to the corresponding respective steps described in connection with the sixth embodiment.

The present embodiment has the following features in addition to the features (1) and (3) of the third embodiment.

(1) Since the etching stopper layer 102 is left only on the side walls of the semiconductor region 101, the stress can be reduced in comparison with the first and fourth embodiments in which the layer 102 is formed over the entire surface. The thermal distortion due to the difference in thermal expansion coefficient between the etching stopper layer and the semiconductor region or between the etching stopper layer and the insulating layer 103 can also be reduced.

(2) By using a deposited layer that has a good coverage for the device isolating insulating layer 103, a seam, which becomes a problem when the layer 103 is formed buried from the top surface, will not be produced in the neighborhood of the interface between the device isolation insulating layer 103 and the gate electrode 108 Thus, the good shape of the device isolation insulating layer 103 can be maintained even after etching and heating steps following the formation of the gate insulating layer.

The present invention is not limited to the embodiments described above. In the embodiments, the device isolation trenches are formed in the semiconductor substrate 101 by means of etching. Alternatively, the trench may be formed by selectively oxidizing the device isolation region by means of LOCOS, peeling off the LOCOS mask, and then selectively etching away the LOCOS oxide layer by an etchant such as ammonium fluoride. Of course, the etching and the LOCOS method may be combined to form the trench.

The above embodiments show the thermal oxidation as the method of creating the insulating layer 104 and the PSG deposition as the method of forming the insulating layers 103 and 103'. Alternatively, oxygen or nitrogen may be implanted at a low accelerating energy on the order of 30 KeV to form an oxide or a nitrogen layer, or insulating layers may be formed by means of deposition. These methods may be combined. Although the insulating layer 104 is described as having a thickness of 5 nm, it is only required to be equal to or less than the gate insulating layer 112 in thickness. The thickness of the insulating layer 104 can be set in the range of 5 to 50 nm for example.

To form insulating layers, other methods than the above method of converting silicon to silicon oxide or silicon nitride may be used. For example, ion implantation of oxygen or nitrogen into a deposited layer of silicon or oxidation of a deposited layer of silicon can be used. As silicon oxide layer, silicate glass such as PSG or BPSG, or deposited oxide layer such as TEOS (tetraethylorthossilicate) or high density plasma oxide layer can be used. Of course, for this insulating layer, a silicon nitride layer, a ferroelectric layer such as a layer of barium titanate, titanate, or the like, a paraelectric layer of barium titanate, tantalum oxide, or the like, or a single layer or compound layer of AlGaAs mixed crystal for GaAs substrate can be used.

Figure 18A:
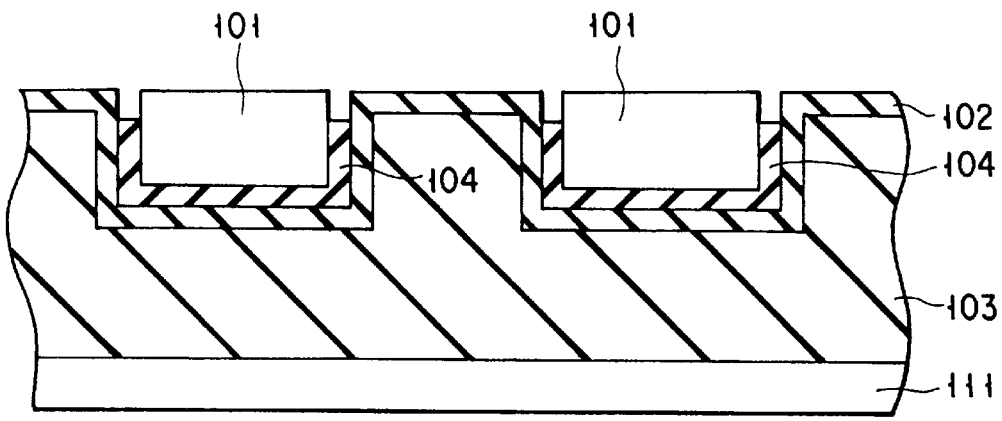
FIGS. 18A and 18B illustrate, in sectional view, a modification of the invention in the manufacturing step prior to the formation of the gate insulating layer and in the manufacturing step after the formation thereof.
Figure 18B:
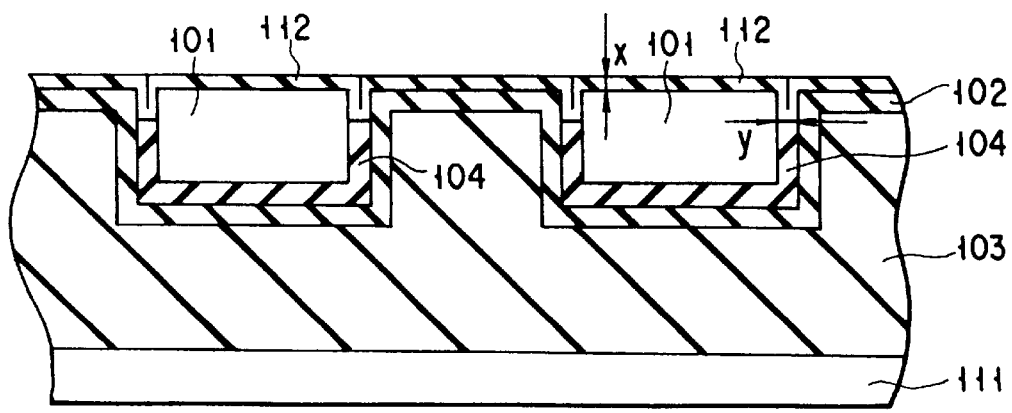

As the gate insulating layer 112, a deposited layer or a compound layer of a deposited layer and an oxide or nitride layer may be used. If a deposited layer is used, the loss of the layer 104 due to etching prior to the formation of the gate insulating layer will be made up for by the deposited layer as shown in FIG. 18A. With a deposited layer with good coverage property, a trench having a width less than twice the thickness of the layer can be buried completely. For this reason, if the spacing y between the semiconductor region 101 and the layer 102 is kept below twice the thickness x of the gate deposited layer 112 in FIG. 18B, the edges of the semiconductor region 101 will not be exposed, whereby the structure of the present invention is formed.

In the above embodiments, as the semiconductor region 101, a p-type monocrystalline silicon substrate is supposed. Use may be made of polycrystalline silicon, porous silicon, amorphous silicon, SiGe mixed crystal, SiC mixed crystal, GaAs, or InP. Of course, an n-type semiconductor may be used. In this case, p-type MISFETs, not n-type MISFETs, will be formed.

The n-type source and drain regions 109 are formed by ion implantation of phosphorus or arsenic. As a dopant, antimony may be used. Instead of ion implantation, solid phase diffusion or vapor phase diffusion using BPSG or PSG may be used. Boron may be used to form p-type regions into an n-type substrate. When GaAs is used as the semiconductor region 101, as a dopant for source and drain regions use may be made of Ge, Si, or Sn for n-type regions and Zn or Be for p-type regions, which are solid phase diffused or ion implanted.

As the supporting substrate 111, use may be made of a silicon substrate, a GaAs substrate, an InP substrate, a silicon oxide substrate, an aluminum oxide substrate, a diamond substrate, an SiC substrate, or a combination of these substrates.

In the first, second, fourth and fifth embodiments, a deposited silicon nitride layer is used as the etching stopper layer 102. The silicon nitride layer may be formed by first depositing a layer of silicon and next subjecting the layer to thermal nitriding or ion implantation of nitrogen. Instead of the silicon nitride layer, use may be made of a single layer or compound layer of a ferroelectric material such as a layer of barium titanate, titanate, or the like, or a paraelectric material layer of barium titanate, tantalum oxide, or the like.

As the etching stopper layer 102' in the embodiments 3, 6 and 7, use is made of a polycrystalline silicon layer. Instead, use may be made of a single or compound layer of monocrystalline silicon, porous silicon, amorphous silicon, SiGe mixed crystal, SiC mixed crystal, W, Ta, Ti, or Al. W, Ta, Ti and Al layers are converted to insulators when subjected to oxidation or nitriding.

As the gate electrode 108, $POCl_3$-diffused polycrystalline silicon is used. Alternatively, arsenic-implanted silicon layer may be used. Or, phosphorus or arsenic may be solid phase diffused into a silicon layer using PSG or AsSG. Or a doped silicon layer may be used which is doped with phosphorus, arsenic or boron. Instead of polycrystalline, use may be made of monocrystalline silicon, porous silicon, amorphous silicon, a metal such as W, Ta, Ti, Hf, Co, Pt, Pd, Al, Cu, or the like, or a metal silicide. Or, a multilayered gate structure using these materials may be used.

Moreover, the present invention can be applied to a mesa type of device isolation in a substrate in which a semiconductor layer is formed on an insulating substrate (SOI substrate; corresponding to the embodiments 4 to 7). That is, semiconductor layers in which devices are to be formed are left in the form of lands on an insulating substrate by means of etching, and an insulating layer, such as an SiN layer, is formed along the side walls of each land-like semiconductor layer. In this case, the spacing between the insulating layer and the land-like semiconductor layer can be made to be less than the thickness of the gate insulating layer of a MISFET formed in that layer, thereby providing the same advantages as the above embodiments.

According to the present invention, by substituting an insulating layer that is hard to be etched by preprocessing for gate electrode formation for a device isolation insulating layer of a trench type in the neighborhood of a semiconductor region, the exposure of edges of the semiconductor region which may be caused by the preprocessing can be prevented, thereby reducing the effect of an edge parasitic transistor. According to the present invention, therefore, there are provided a semiconductor device with improved reproducibility and a method of manufacturing the same.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor substrate having a major surface;

a semiconductor region defined in said major surface and located between two trenches formed in said major surface;

a first insulating layer formed adjacent to and along side walls of said trenches;

a second insulating layer formed on an upper surface of said semiconductor region and upper regions of said side walls of said trenches, which correspond to upper regions of side walls of said semiconductor region, said second insulating layer contacting said first insulating layer on said upper regions of said side walls of said trenches; and a fourth insulating layer formed between said first insulating layer and said side walls of said trenches, an upper end portion of said fourth insulating layer being butt-joined to said second insulating layer, an upper end portion of said first insulating layer being formed in contact and along said second insulating layer where said second insulating layer is formed on said upper regions of said side walls of said trenches, so as to sandwich said second insulating layer between the first insulating layer and said side walls of said trenches.

2. The semiconductor device according to claim 1, wherein said first insulating layer includes a layer of silicon nitride.

3. The semiconductor device according to claim 1, further comprising a third insulating layer that is embedded in each of said trenches with said first insulating layer interposed between said third insulating layer and said side walls of each of said trenches, such that an upper surface of said third insulating layer is set lower than said main surface of said semiconductor substrate.

4. The semiconductor device according to claim 3, further comprising a conductive layer formed to overlie said first, said second and said third insulating layer.

5. The semiconductor device according to claim 4, wherein said conductive layer is a gate electrode and said second insulating layer is a gate insulating layer.

6. A semiconductor device comprising:

a semiconductor substrate having a major surface;

a semiconductor region defined in said major surface and located between two trenches formed in said major surface;

a first insulating layer formed adjacent to and along side walls of said trenches;

a second insulating layer formed on an upper surface of said semiconductor region and upper regions of said side walls of said trenches, which correspond to upper regions of side walls of said semiconductor region, said second insulating layer contacting said first insulating layer on said upper regions of said side walls of said trenches;

a third insulating layer embedded in each of said trenches with said first insulating layer interposed between said third insulating layer and said side walls of said trenches, such that an upper surface of said third insulating layer is set lower than said major surface of said semiconductor substrate; and a fourth insulating layer formed between said first insulating layer and said side walls of said trenches, an upper end portion of said fourth insulating layer being butt-joined to said second insulating layer, said first insulating layer extending to at least a same plane as said major surface of said semiconductor substrate along said side walls of said trenches, so as to sandwich said second insulating layer between the first insulating layer and said side walls of said trench, and a distance between said first insulating layer and said side walls being set less than a thickness of a portion of said second insulating layer which is formed on said major surface of said semiconductor substrate.

7. The semiconductor device according to claim 6, wherein said first insulating layer comprises a silicon nitride layer, and said third insulating layer comprises a silicon oxide layer.

8. The semiconductor device according to claim 6, wherein a thickness of said fourth insulating layer being equal to or less than the thickness of said second insulating layer at a portion thereof formed on said major surface of said semiconductor substrate.

9. The semiconductor device according to claim 6, further comprising a conductive layer formed to overlie said first, said second and said third insulating layer.

10. The semiconductor device according to claim 9, wherein said conductive layer is a gate electrode and said second insulating layer is a gate insulating layer.

11. A semiconductor device comprising:

an insulative base layer having a trench in a major surface thereof;

a first insulating layer formed adjacent to and along at least corresponding one of upper regions of side walls of said trench;

a semiconductor region embedded in said trench with said first insulating layer interposed between said semiconductor region and said at least said upper regions of said side walls of said trench; and a second insulating layer formed at least on an upper surface of said semiconductor region, said second insulating layer contacting said first insulating layer, said first insulating layer extending to at least a same plane as said major surface of said semiconductor region along said at least upper regions of side walls of said semiconductor region.

12. The semiconductor device according to claim 11, wherein said first insulating layer comprises a silicon nitride layer.

13. The semiconductor device according to claim 11, further comprising a third insulating layer formed between said first insulating layer and said side walls of said semiconductor region other than at said upper regions of said semiconductor region, wherein said second insulating layer is formed on said upper regions of said side walls of said trench, to be integral with said second insulating layer formed on said upper surface of said semiconductor region, so as to be sandwiched between an upper end portion of said first insulating layer and said upper regions of said side walls of said trench, and to butt-join with said third insulating layer, and a thickness of said third insulating layer is less than a thickness of said second insulating layer measured on said upper surface of said semiconductor region.

14. The semiconductor device according to claim 13, further comprising a conductive layer formed to overlie said first, said second and said third insulating layer.

15. The semiconductor device according to claim 14, wherein said conductive layer is a gate electrode and said second insulating layer is a gate insulating layer.

16. The semiconductor device according to claim 1, wherein said semiconductor substrate is made of silicon and said fourth insulating layer includes a layer or silicon oxides, which contacts said semiconductor substrate.

17. The semiconductor device according to claim 1, wherein a top end of said first insulating layer is positioned higher than said major surface of said semiconductor substrate.

18. The semiconductor device according to claim 3, wherein each of said trenches that is lined with the first insulating layer is filled substantially solely with said third insulating layer.

19. The semiconductor device according to claim 3, said third insulating layer is formed of silicon oxide.

20. The semiconductor device according to claim 6, wherein said distance is less than the thickness of said second insulating layer.

21. The semiconductor device according claim 6, wherein an upper end portion of said first insulating layer provided along said side walls of said trenches is positioned higher than said major surface of said semiconductor substrate.

* * * * *